(12) United States Patent
Sun et al.

(10) Patent No.: US 11,960,169 B2
(45) Date of Patent: Apr. 16, 2024

(54) BACKLIGHT MODULE, PREPARATION METHOD THEREOF AND DISPLAY DEVICE

(71) Applicant: Shanghai AVIC Optoelectronics Co., Ltd., Shanghai (CN)

(72) Inventors: Dongyun Sun, Shanghai (CN); Yankun Chu, Shanghai (CN); Xiao Yang, Shanghai (CN)

(73) Assignee: Shanghai Avic Optoelectronics Co., Ltd., Shanghai (CN)

( * ) Notice: Subject to any disclaimer, the term of this patent is extended or adjusted under 35 U.S.C. 154(b) by 131 days.

(21) Appl. No.: 17/699,505

(22) Filed: Mar. 21, 2022

(65) Prior Publication Data

US 2022/0206339 A1    Jun. 30, 2022

(30) Foreign Application Priority Data

Dec. 2, 2021 (CN) .......................... 202111516318.1

(51) Int. Cl.
- G02F 1/13357 (2006.01)
- H01L 25/075 (2006.01)
- H01L 33/60 (2010.01)

(52) U.S. Cl.
CPC .. G02F 1/133611 (2013.01); G02F 1/133603 (2013.01); G02F 1/133605 (2013.01); G02F 1/133608 (2013.01); H01L 25/0753 (2013.01); H01L 33/60 (2013.01); *H01L 2933/0058* (2013.01)

(58) Field of Classification Search
CPC ......... G02F 1/133611; G02F 1/133603; G02F 1/133605; G02F 1/133608; G02F 1/133607; G02F 2201/54; H01L 25/0753; H01L 33/60; H01L 2933/0058
See application file for complete search history.

(56) References Cited

U.S. PATENT DOCUMENTS

| | | | |
|---|---|---|---|
| 2010/0141867 A1 | 6/2010 | Ogihara | |
| 2021/0200026 A1 | 7/2021 | Sonobe | |

FOREIGN PATENT DOCUMENTS

| | | |
|---|---|---|
| CN | 104566043 A | 4/2015 |
| CN | 207689804 U | 8/2018 |
| CN | 107179630 B | 11/2019 |

(Continued)

OTHER PUBLICATIONS

Machine translation of CN-214041938-U (Year: 2021).*

*Primary Examiner* — Anne M Hines
*Assistant Examiner* — Jose M Diaz
(74) *Attorney, Agent, or Firm* — KDW Firm PLLC

(57) ABSTRACT

Provided are a backlight module, a preparation method thereof, and a display device. The backlight module includes a substrate, multiple light-emitting elements, a reflection structure and a rubber frame structure, and the multiple light-emitting elements, the reflection structure and the rubber frame structure are located on one side of the substrate. The multiple light-emitting elements and the reflection structure are located within a limited area of the rubber frame structure, and the reflection structure is located between every two adjacent light-emitting elements; and the reflection structure includes a first reflection surface adjacent to a light-emitting element, and the rubber frame structure includes a second reflection surface adjacent to the light-emitting element.

20 Claims, 10 Drawing Sheets

(56) References Cited

FOREIGN PATENT DOCUMENTS

| | | | | |
|---|---|---|---|---|
| CN | 110426894 | A | 11/2019 | |
| CN | 214041938 | U * | 8/2021 | ....... G02F 1/133603 |
| KR | 20140141271 | A | 12/2014 | |
| WO | 202015897 | A1 | 8/2020 | |
| WO | 2020158976 | A1 | 8/2020 | |

* cited by examiner

BACKLIGHT MODULE, PREPARATION METHOD THEREOF AND DISPLAY DEVICE

CROSS-REFERENCE TO RELATED APPLICATION(S)

This application claims priority to Chinese Patent Application No. 202111516318.1 filed Dec. 2, 2021, the disclosure of which is incorporated herein by reference in its entirety.

TECHNICAL FIELD

Embodiments of the present disclosure relate to the field of display technologies and, in particular, to a backlight module, a preparation method thereof and a display device.

BACKGROUND

With the continuous development of liquid crystal display technology, liquid crystal display devices have been widely used in all aspects of life. The liquid crystal display device includes a backlight module and a display panel. The backlight module provides a light source for the display panel and is an indispensable part of the liquid crystal display device.

When the existing display module has a direct type backlight, a series of light-outgoing problems occur due to the limitation of the optical characteristics of light-emitting diode (LED).

SUMMARY

Embodiments of the present disclosure provide a backlight module, a preparation method and a display device.

In a first aspect, provided is a backlight module, including a substrate; and multiple light-emitting elements, a reflection structure and a rubber frame structure. The multiple light-emitting elements, the reflection structure, the rubber frame structure are located on one side of the substrate. The multiple light-emitting elements and the reflection structure are located within a limited area of the rubber frame structure, the reflection structure is located between every two adjacent light-emitting elements of the multiple light-emitting elements, the reflection structure includes a first reflection surface adjacent to a light-emitting element, and the rubber frame structure includes a second reflection surface adjacent to the light-emitting element.

In a second aspect, provided is a preparation method of a backlight module. The method includes the steps described below.

A substrate is provided.

Multiple light-emitting elements, a reflection structure and a rubber frame structure are prepared on one side of the substrate. The multiple light-emitting elements and the reflection structure are located within a limited area of the rubber frame structure, and the reflection structure is located between every two adjacent light-emitting elements; and the reflection structure includes a first reflection surface adjacent to a light-emitting element, and the rubber frame structure includes a second reflection surface adjacent to the light-emitting element.

In a third aspect, provided is a display device. The display device includes the display panel provided by any embodiment of the present disclosure.

BRIEF DESCRIPTION OF DRAWINGS

To illustrate the solutions in embodiments of the present disclosure or the solutions in the related art more clearly, drawings used in the description of the embodiments or the related art are described briefly hereinafter. Apparently, the drawings described hereinafter illustrate only part of embodiments of the present disclosure. For those skilled in the art, other structures and drawings may be extended and expanded based on basic concepts of an element structure, driving method and manufacturing method disclosed and suggested by various embodiments of the present disclosure. It is undoubtedly that these should be within the scope of claims of the present disclosure.

DETAILED DESCRIPTION

In order that the objects, solutions, and advantages of the present disclosure are clearer, the solutions of the present disclosure are described more clearly and completely hereinafter with reference to drawings of embodiments of the present disclosure and in conjunction with implementations. Apparently, the embodiments described herein are some embodiments, not all embodiments, of the present disclosure. All other embodiments obtained by those skilled in the art based on the basic concepts disclosed and indicated in embodiments of the present disclosure are within the scope of the present disclosure.

Figure 1:
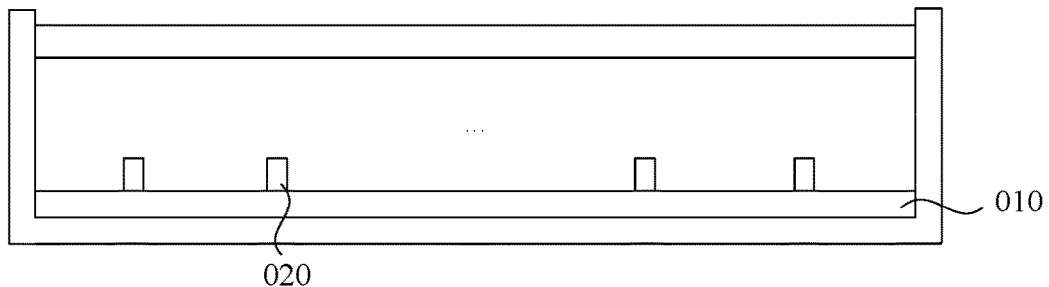
FIG. 1 is a sectional view of a backlight module provided in the related art.

FIG. 1 is a sectional view of a backlight module provided in the related art. As shown in FIG. 1, the backlight module 01 in the related art includes a backlight plate 010 and a light-emitting element 020. Since optical characteristics of the light-emitting element 020 have limitations, in the related technology, a spacing between the light-emitting elements 020 is reduced to improve the contrast and uniformity of the light-outgoing brightness of the backlight module 01, but such manner will cause a great increase of the preparation cost and is not suitable for industrialization, and will also cause light crosstalk between adjacent light-emitting elements 020 and affect the light-outgoing contrast. To control the cost of the light-emitting element 020, the contrast and the uniformity of the light-outgoing brightness are improved by increasing the light mixing distance in the related art but the thickness of the backlight module 01 can be increased.

Based on the preceding problems, the embodiment of the present disclosure provides a backlight module. The backlight module includes a substrate, multiple light-emitting elements, a reflection structure and a rubber frame structure, and the multiple light-emitting elements, the reflection structure and the rubber frame structure are located on one side of the substrate. The multiple light-emitting elements and the reflection structure are located within a limited area of the rubber frame structure, and the reflection structure is located between every two adjacent light-emitting elements. The reflection structure includes a first reflection surface adjacent to a light-emitting element, and the rubber frame structure includes a second reflection surface adjacent to the light-emitting element.

In the backlight module provided by the embodiment of the present disclosure, the reflection structure is disposed between every two adjacent light-emitting elements, and the reflection structure blocks the crosstalk between the outgoing lights of the adjacent light-emitting elements, so that the problem of low contrast of the light-outgoing brightness is solved. The light-emitting elements and the reflection structure are located within an area limited by the rubber frame structure, the reflection structure and the rubber frame structure adjust and reflect the outgoing light of the light-emitting element so as to adjust the light-outgoing amounts of different areas, ensure good light-emitting uniformity of different areas and solve the problem of poor light-outgoing uniformity. Moreover, since the reflection structure and the rubber frame structure both include a reflection surface adjacent to the light-emitting element, the outgoing light is repeatedly reflected on the reflection surface and a film layer above the reflection surface to increase the light mixing distance, so that the thickness of the backlight module is relatively small under the premise of ensuring a proper light mixing distance, and the problem that the thickness of the backlight module is relatively large can also be solved.

The above is the core concept of the present disclosure, and solutions in embodiments of the present disclosure will be described clearly and completely in conjunction with the drawings in embodiments of the present disclosure. Based on embodiments of the present disclosure, all other embodiments obtained by those of ordinary skill in the art without creative work are within the scope of the present disclosure.

Figure 2:
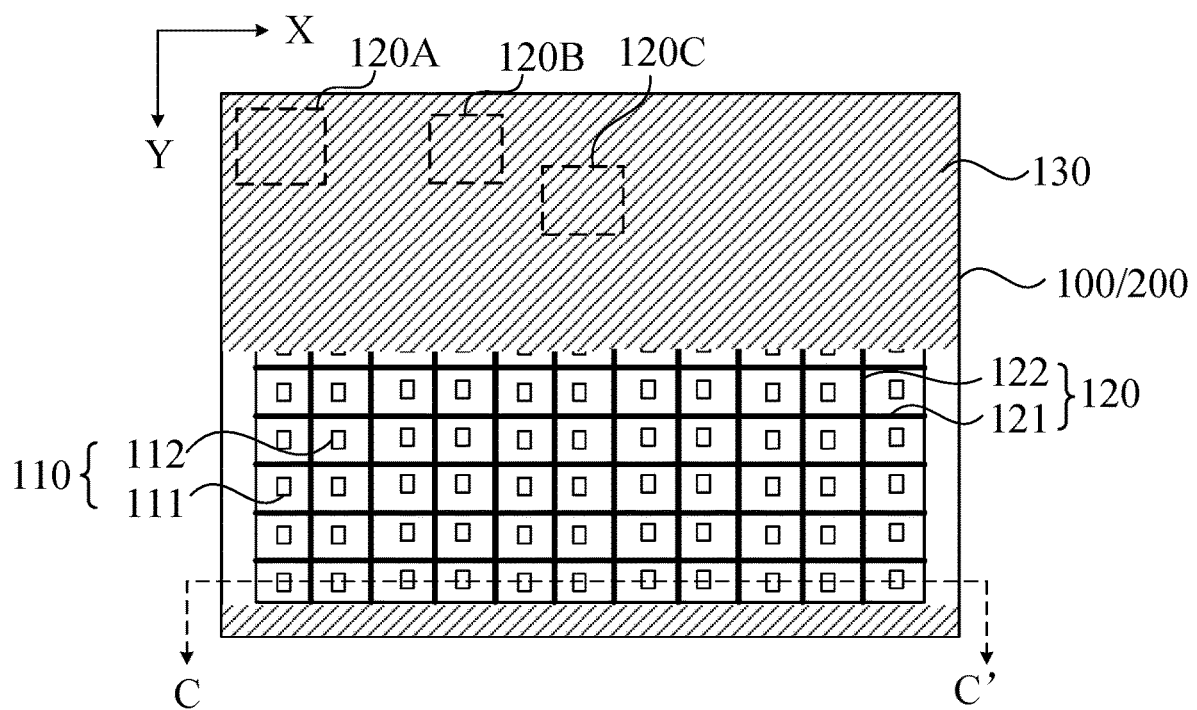
FIG. 2 is a top view of a backlight module provided by an embodiment of the present disclosure.
Figure 3:
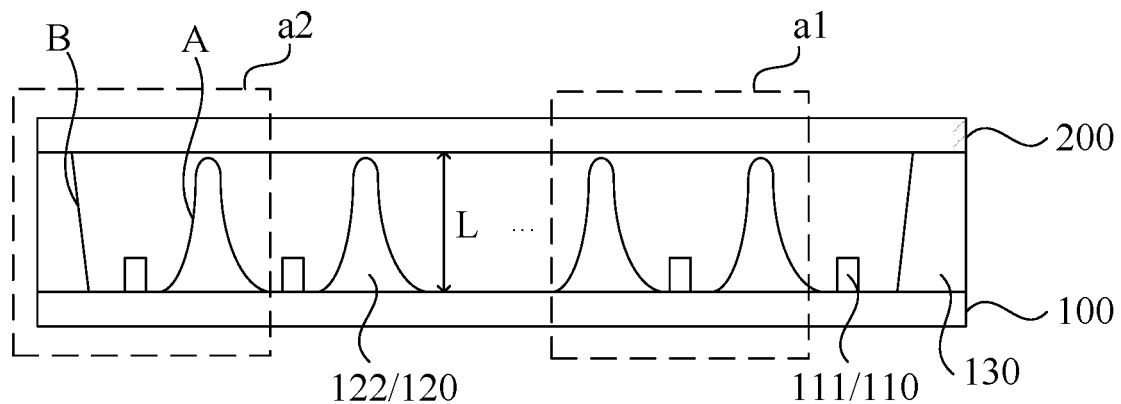
FIG. 3 is a sectional view taken along a line CC' of FIG. 2.

FIG. 2 is a top view of a backlight module provided by an embodiment of the present disclosure. FIG. 3 is a sectional view taken along a line CC' of FIG. 2. Referring to FIGS. 2 and 3, an embodiment of the present disclosure provides a backlight module 10. The backlight module 10 includes a substrate 100, multiple light-emitting elements 110, a reflection structure 120 and a rubber frame structure 130, the multiple light-emitting elements 110, the structure 120 and the rubber frame structure 130 are located on one side of the substrate 100. The multiple light-emitting elements 110 and the reflection structure 120 are located within a limited area of the rubber frame structure 130, and the reflection structure 120 is located between every two adjacent light-emitting elements 110. The reflection structure 120 includes a first reflection surface A adjacent to the light-emitting element 110, and the rubber frame structure 130 includes a second reflection surface B adjacent to the light-emitting element 110.

In an embodiment, referring to FIGS. 2 and 3, the backlight module 10 provided by the embodiment of the present disclosure includes the substrate 100, the multiple light-emitting elements 110, the reflection structure 120 and the rubber frame structure 130. The substrate 100 serves as a bearing substrate for the light-emitting elements 110, and a drive circuit electrically connected to the light-emitting elements 110 may be provided above, below or inside the substrate 100, and configured to supply a light-emitting drive signal to the light-emitting elements 110.

The light-emitting element 110 includes a light-emitting diode which may be an electronic element such as a Mini light-emitting diode (Mini LED) or a Micro light-emitting diode (Micro LED) and serves as a light-outgoing source of the backlight module 10. The light-emitting diode (LED) is a type of semiconductor electronic element that converts electric energy into light energy, and is widely used due to its advantages such as small size, long service life, rich colors and low energy consumption. Since the electronic element such as the Mini LED or the Micro LED is small in size, the light-emitting element 110 is configured to include the Mini LED or the Micro LED, so that more light-emitting elements 110 can be provided in the backlight module 10 having the same size, which is beneficial to achieving fine light-outgoing control of the backlight module 10. Further, the light-emitting element 110 has a relatively large light-emitting angle, for example, greater than 120°. Alternatively, the light-emitting element 110 may include multiple light-emitting surfaces, for example, a top surface and side surfaces are all light-emitting surfaces, so that the outgoing light of the light-emitting element 110 may be emitted to the reflection structure 120 and the rubber frame structure 130, and the outgoing light of the backlight module 10 is adjusted through the reflection structure 120 and the rubber frame structure 130.

The reflection structure 120 is located between every two adjacent light-emitting elements 110. The reflection structure 120 includes a first reflection surface A adjacent to a light-emitting element 110, and light emitted from the light-emitting element 110 is reflected by the first reflection surface A. On the one hand, a light-outgoing direction of the backlight module 10 can be adjusted, for example, more light is reflected and then emitted to a place where the light-emitting brightness of the backlight module 10 is low, which is beneficial to achieving the light-outgoing uniformity of the backlight module 10; and on the other hand, the reflection structure 120 can block the light crosstalk between every two adjacent light-emitting elements 110, which is beneficial to improving the light-outgoing contrast of the backlight module 10. Further, the specific structure of the reflective structure 120 is not limited in the embodiment of the present disclosure. Exemplarily, multiple reflection structures 120 may be arranged separately, that is, each reflection structure 120 is an independent structure, and each reflection structure 120 is located between every two adjacent light-emitting elements 110. Alternatively, the reflection structure 120 may be an integrally arranged mesh structure, that is, a mesh structure formed by multiple reflection structures 120 is arranged around the light-emitting elements 110, which is not limited in the embodiment of the present disclosure, and it is only necessary to ensure that the reflection structure 120 includes the first reflection surface A adjacent to the light-emitting element 110 so as to ensure that the light emitted by the light-emitting element 110 can be reflected.

The rubber frame structure 130 limits the arrangement area of the light-emitting elements 110 and the reflection structure 120, i.e., the rubber frame structure 130 is located in an edge area of the backlight module 10. Further, the rubber frame structure 130 includes the second reflection surface B adjacent to the light-emitting element 110, the light emitted from the light-emitting element 110 is reflected by the second reflection surface B, and a light-outgoing direction of the edge area of the backlight module 10 is adjusted. For example, more light is reflected and then emitted towards the edge area of the backlight module 10, which is beneficial to improving the light-emitting brightness of the edge area of the backlight module 10 and achieving the light-outgoing uniformity of the backlight module 10. Further, the second reflection surface B may be configured by attaching a reflection sheet or a reflection film to one side of the rubber frame structure 130 adjacent to the light-emitting element 110, thereby ensuring a simple arrangement of the second reflection surface B.

Further, the rubber frame structure 130 provided by the embodiment of the present disclosure is an independent structure independent of the reflection structure 120, and the configuration of the rubber frame structure 130 is not limited by the configuration of the reflection structure 120 and thus has a relatively high configuration freedom. Moreover, since the rubber frame structure 130 is configured to bond the substrate 100 and a film layer above the substrate 100 to leave a space for configuring the light-emitting elements 110, the rubber frame structure 130 is an indispensable structure in the backlight module. With respect to configure a reflection cup at the edge of the backlight module, such as the solution in which the reflection cup which is an integral structure is arranged in the edge area and a non-edge area of the backlight module, the reflection cup and the rubber frame structure in the edge area both occupy a certain edge space, which is easy to cause the problem that the edge of the backlight module is too wide, and is not beneficial to achieving the narrow bezel arrangement of the backlight module. In the solution of the embodiment of the present disclosure, the second reflection surface B is configured by directly attaching the reflection sheet or the reflection film to the one side of the rubber frame structure 130 adjacent to the light-emitting element 110, which facilitates the narrow bezel design of the backlight module on the basis of achieving the edge light-outgoing adjustment.

Further, the rubber frame structure 130 provided by the embodiment of the present disclosure is an independent structure independent of the substrate 100, and the configuration of the rubber frame structure 130 is not limited by the configuration of the substrate 100 and thus has a relatively high configuration freedom. With respect to the solution in which a bottom plate of the backlight module is bent directly to the side of the backlight module to form an edge cover, if the bottom plate has a glue structure, the glue structure that the bottom surface and the side surface are integrated will cause poor heat dissipation performance of the backlight module and shorten the service life of the backlight module; and if the bottom plate has a metal structure, there must be a rubber frame structure between the side of the backlight module and the light-emitting element, even if the bottom plate is coated with the reflection ink, the light emitted from the light-emitting element first reaches the reflection ink through the rubber frame structure, and then emitted through the rubber frame structure after being reflected by the reflection ink, so that the adjustment ability of a reflection module to the light is greatly reduced and the edge light-outgoing effect is affected.

In the backlight module provided by the embodiment of the present disclosure, the reflection structure and the rubber frame structure are added, and the reflection structure is disposed between every two adjacent light-emitting elements, so that the reflection structure blocks the crosstalk between the outgoing lights of the adjacent light-emitting elements, and the problem of low contrast of the light-outgoing brightness is solved. The light-emitting elements and the reflection structure are all located in an area limited by the rubber frame structure, the reflection structures and the rubber frame structure adjust and reflect the outgoing lights of the light-emitting elements, so as to adjust the light-outgoing amount of different areas, ensure good light-outgoing uniformity of different areas and solve the problem of poor light-outgoing uniformity. Meanwhile, since the reflection structure and the rubber frame structure both include a reflection surface adjacent to the light-emitting element, the outgoing light is repeatedly reflected on the reflection surface and a film layer above the reflection surface to increase the light mixing distance, so that the thickness of the backlight module is relatively small under the premise of ensuring a proper light mixing distance, for example, the light mixing distance of the backlight module provided by the embodiment of the present disclosure can be reduced to 4 mm, which can solve the problem that the thickness of the backlight module is relatively large with respect to the light mixing distance of 6 to 7 mm of the backlight module in the existing art.

Referring to FIG. 2, the multiple light-emitting elements 110 are arranged in an array in a first direction X and a second direction Y, the first direction X and the second direction Y intersect with each other and are both parallel to a plane where the substrate 100 is located. The reflection structure 120 include a first sub-reflection structure 121 extending in the first direction X and a second sub-reflection structure 122 extending in the second direction Y, the first sub-reflection structure 121 and the second sub-reflection structure 122 intersect with each other to limit at least a part of edges of an arrangement area of the light-emitting element 110.

In an embodiment, the multiple light-emitting elements 110 are arranged in an array in a first direction X and a second direction Y. The reflection structure 120 may be an integrally arranged mesh structure, for example, the reflection structure 120 includes the first sub-reflection structure 121 and the second sub-reflection structure 122. The first sub-reflection structure 121 extends in the first direction X and the second sub-reflection structure 122 extends in the second direction Y, the first sub-reflection structure 121 and the second sub-reflection structure 122 intersect with each other to limit at least a part of edges of the arrangement area of the light-emitting element 110. Further, multiple first sub-reflection structures 121 are identical in structure and multiple second sub-reflection structures 122 are identical in structure, thereby reducing the implementation complexity of the reflection structure 120. Further, the case where the arrangement area of each light-emitting element 110 in FIG. 2 is a rectangle is used as an example, at least a part of edges may be understood as at least two arrangement edges. For the light-emitting elements 110 at different positions, the limitations of the reflection structure 120 to the arrangement areas of the light-emitting elements 110 are different, but for the light-emitting element 110 at any position, the reflection structure 120 can limit at least a part of edges of the light-emitting element 110, and the first reflection surface A can adjust the light outgoing of the light-emitting element 110 to ensure the overall light-outgoing effect of the backlight module 10.

Referring to FIG. 2, the multiple light-emitting elements 110 include a first-type light-emitting element 111 and a second-type light-emitting element 112. The first-type light-emitting element 111 is located at an edge position of the backlight module 10, the first sub-reflection structure 121 and the second sub-reflection structure 122 limit a part of edges of an arrangement area of the first-type light-emitting element 111, and the rubber frame structure 130 limits a remaining part of the edges of the arrangement area of the first-type light-emitting element 111. The second-type light-emitting element 112 is located within a non-edge position of the backlight module 10, the first sub-reflection structure 121 and the second sub-reflection structure 122 limit all of edges of an arrangement area of the second-type light-emitting element 112.

In an embodiment, the light-emitting element 110 includes the first-type light-emitting element 111 and the second-type light-emitting element 112. The first-type light-emitting element 111 is located at the edge position of the backlight module 10, and a position of the first-type light-emitting element 111 is limited by the first sub-reflection structure 121, the second sub-reflection structure 122 and the rubber frame structure 130. The second-type light-emitting element 112 is located at the non-edge position of the backlight module 10, and a position of the second-type light-emitting element 112 is limited by the first sub-reflection structure 121 and the second sub-reflection structure 122.

Exemplarily, as shown by the area 120A in FIG. 2, the position of the first-type light-emitting element 111 may be limited by the rubber frame structure 130, the first sub-reflection structure 121, and the second sub-reflection structure 122, that is, for the first-type light-emitting element 111 at a corner position, the reflection structure 120 limits two arrangement edges of the first-type light-emitting element 111, and the rubber frame structure 130 limits the other two arrangement edges of the first-type light-emitting element 111. As shown by the area 120B in FIG. 2, the position of the first-type light-emitting element 111 may be limited by the rubber frame structure 130, the first sub-reflection structure 121, and the second sub-reflection structure 122, that is, for the first-type light-emitting element 111 at an edge position and a non-corner position, the reflection structure 120 limits three arrangement edges of the first-type light-emitting element 111, and the rubber frame structure 130 limits the other one arrangement edge of the first-type light-emitting element 111. As shown by the area 120C in FIG. 2, the position of the second-type light-emitting element 112 may be limited by the first sub-reflection structures 121 and the second sub-reflection structures 122, that is, for the second-type light-emitting element 112 at the non-edge position, the reflection structure 120 limits all arrangement edges of the second-type light-emitting element 112. The positions of the first-type light-emitting element 111 and the second-type light-emitting element 112 are limited by the reflection structure 120 and the rubber frame structure 130; on the one hand, the light emitted from the light-emitting element 110 is diffusely reflected on the first reflection surface A and the second reflection surface B, and is scattered by the diffuse reflection, thereby improving the light-outgoing uniformity of the backlight module; and on the other hand, surface types of the first reflection surface A and the second reflection surface B are adjusted so that a light-outgoing direction of the light emitted from the first reflection surface A and the second reflection surface B is adjusted, for example, more light is adjusted to emit to an area having a small light-outgoing amount, thereby improving the light-outgoing uniformity of the backlight module, ensuring that the light outgoing of the light-emitting elements 110 at different positions of the backlight module 10 can be adjusted, and improving the light-outgoing uniformity of each area of the backlight module 10.

On the basis of the preceding embodiments, the arrangement manner of the reflection structure 120 and the rubber frame structure 130 will be described below in detail.

First the arrangement manner of the rubber frame structure 130 is illustrated.

Figure 4:
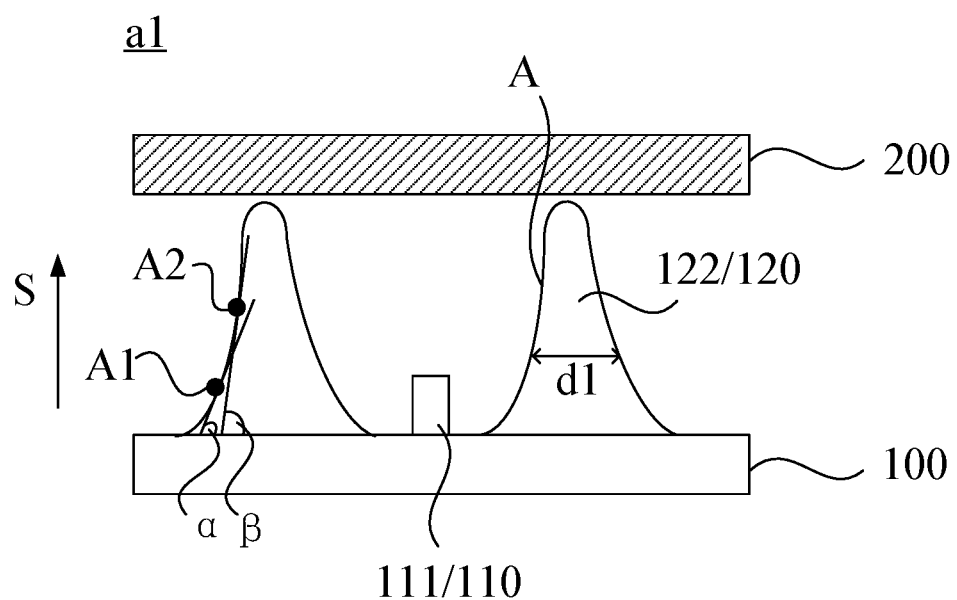
FIG. 4 is an enlarged view of an area a1 in FIG. 3.

FIG. 4 is an enlarged view of an area a1 in FIG. 3. Referring to FIGS. 3 and 4, the first reflection surface A includes a ramp. The ramp includes a plane surface or a curved surface, and a width d1 of the reflection structure 120 is gradually decreased in a light-outgoing direction S of the backlight module.

In an embodiment, the first reflection surface A may be the plane surface or the curved surface, and in FIGS. 3 and 4, only the case where the first reflection surface A is the curved surface is used as an example for illustration.

Exemplarily, as shown in FIG. 4, the width d1 of the reflection structure 120 is gradually decreased in the light-outgoing direction S of the backlight module, that is, the width of a bottom part of the reflection structure 120 is greater than the width of a top part of the reflection structure 120, which can ensure that the light emitted from the light-emitting element 110 is received on the first reflection surface A and then reflected upward, that is, the outgoing light of the light-emitting element 110 is reflected towards one side facing away from the substrate 100, thereby achieving the light-outgoing adjustment of the backlight module 10. With respect to a reflection structure which is wider at the top and narrower at the bottom, the reflection structure 120 provided in the embodiment of the present disclosure can reflect the outgoing light towards the substrate 100, thereby achieving the light-outgoing brightness adjustment and solving the problem of poor light-outgoing uniformity.

Referring to FIG. 4, the first reflection surface A includes the curved surface. The first reflection surface A includes a first reflection position A1 and a second reflection position A2. The first reflection position A1 is located on one side of the second reflection position A2 adjacent to the substrate 100, and the first reflection position A1 is located on one side of the second reflection position A2 adjacent to the light-emitting element 110. An included angle between a tangent line at the first reflection position A1 and a plane where the substrate 100 is located is a, and an included angle between a tangent line at the second reflection position A2 and the plane where the substrate 100 is located is β, where $0°<\alpha<\beta\leq90°$.

In an embodiment, the first reflection surface A includes the first reflection position A1 and the second reflection position A2. The first reflection position A1 is closer to the substrate 100 than the second reflection position A2 and closer to the light-emitting element 110 than the second reflection position A2. Further, the included angle α between the tangent line at the first reflection position A1 and the plane where the substrate 100 is located and the included angle β between the tangent line at the second reflection position A2 and the plane where the substrate 100 is located satisfy $0°<\alpha<\beta\leq90°$, that is, the reflection structure 120 as shown in FIG. 4 is formed. With respect to a parabolic reflection structure (not shown in the figure) in which a is greater than β, the solution in the embodiment of the present disclosure can emit more light emitted from the light-emitting element 110 from a vicinity of the reflection structure 120, which increases the light-outgoing amount near the reflection structure 120 and reduces the light-outgoing amount directly above the light-emitting element 110, thereby further improving the light-outgoing uniformity, and improving the problem of poor light-outgoing uniformity of the backlight module.

To sum up, the shape of the reflection structure 120 is reasonably configured so as to ensure that the light reflected by the reflection structure 120 is emitted from the light-outgoing side of the backlight module and that more light is emitted from the vicinity of the reflection structure 120, thereby increasing the light-outgoing amount of the vicinity of the reflection structure 120, reducing the light-outgoing amount directly above the light-emitting element 110, thereby further improving the light-outgoing uniformity.

The arrangement manner of the rubber frame structure 130 is illustrated.

Figure 5:
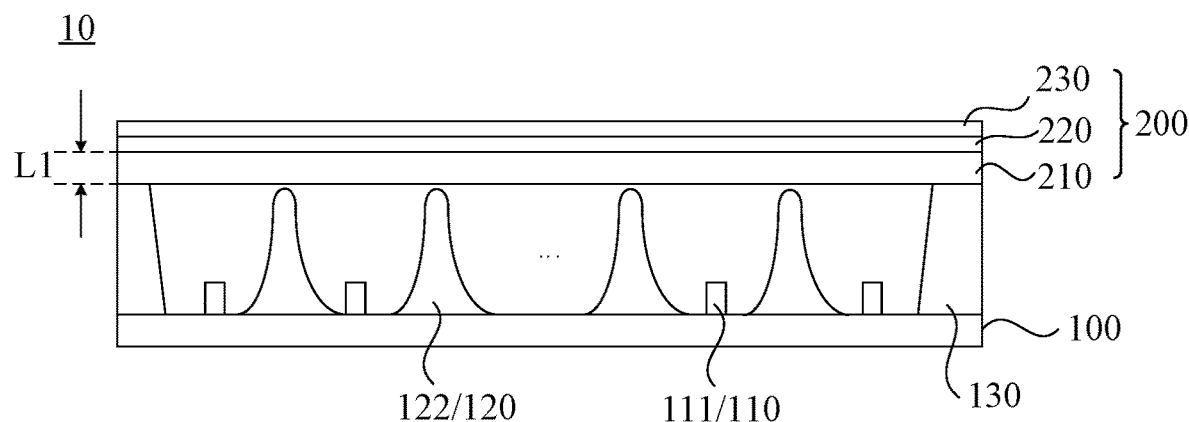
FIG. 5 is another sectional view taken along a line CC' of FIG. 2.

FIG. 5 is another sectional view taken along a line CC' of FIG. 2. As shown in FIG. 5, the backlight module 10 further includes an optical film 200 located on one side of the reflection structure 120 and the rubber frame structure 130 facing away from the substrate 100.

In an embodiment, the optical film 200 may include a diffusion sheet 210, a diffusion film 220, a brightness enhancement film 230. The embodiment of the present disclosure does not specifically limit the film layers included in the optical film 200. The diffusion sheet 210 and the diffusion film 220 are used for diffusing the light emitted from the light-emitting element 110 on the optical film 200 to improve the light-outgoing uniformity of the backlight module 10. The brightness enhancement film 230 is used for brightening the light emitted from the light-emitting element 110 on the optical film 200 to improve the light-outgoing effect of the backlight module 10. Further, the light emitted from the light-emitting element 110 is reflected back and forth between the optical film 200 and the reflection structure 120 as well as between the optical film 200 and the rubber frame structure 130, so that the light path of the light can be increased and the light mixing distance can be prolonged, thereby achieving the thinning of the backlight module 10 and solving the problem of the larger thickness of the backlight module.

Referring to FIG. 5, the thickness L1 of the optical film 200 satisfies 1 mm≤L1≤2 mm.

In an embodiment, the thickness L1 of the optical film in the backlight module 10 provided by the embodiment of the present disclosure satisfies 1 mm≤L1≤2 mm. Exemplarily, the thickness L1 of the optical film 200 may be 1 mm, 2 mm, or any value between 1 mm and 2 mm. The thickness of the optical film 200 is reasonably configured, which on the one hand, reduces the thickness of the backlight module 10, and on the other hand, is beneficial to achieve the thinning design of the backlight module 10.

Figure 6:
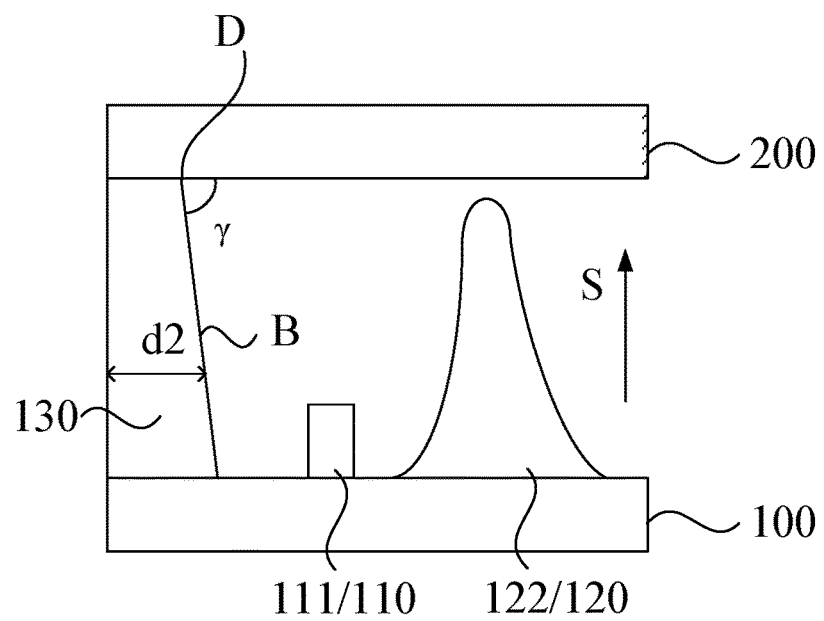
FIG. 6 is an enlarged view of an area a2 in FIG. 3.
Figure 7:
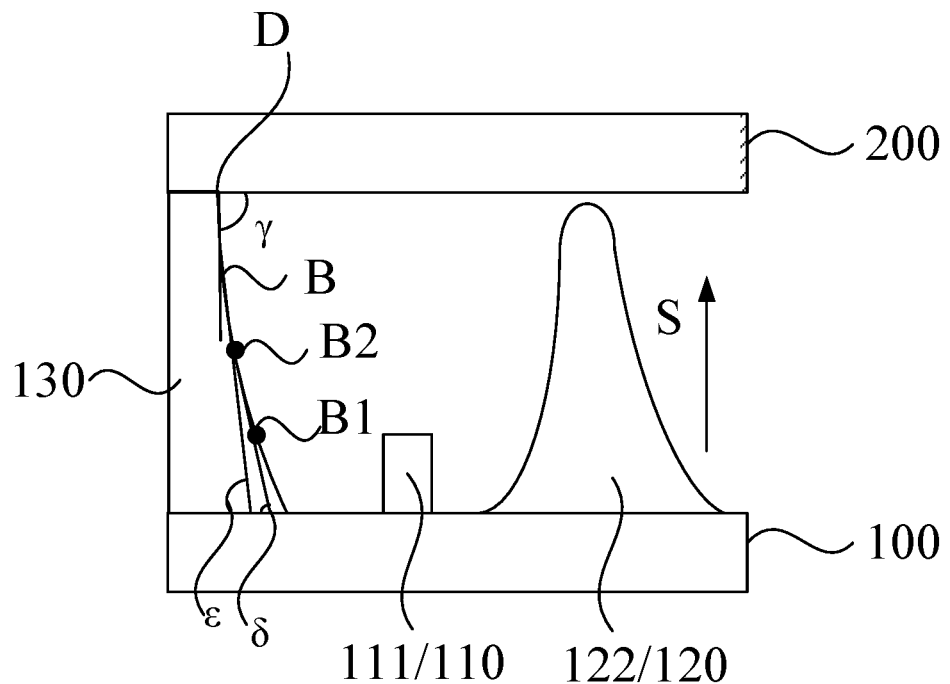
FIG. 7 is a structure diagram of a rubber frame structure provided by an embodiment of the present disclosure.

FIG. 6 is an enlarged view of an area a2 in FIG. 3. FIG. 7 is a structure diagram of a rubber frame structure provided by an embodiment of the present disclosure. Referring to FIGS. 6 and 7, the second reflection surface B is in contact with the optical film 200 at a contact point D, and the contact point D is located on the second reflection surface B. An included angle γ between one surface of the optical film 200 facing towards the substrate 100 and a tangent line at a position of the contact point D satisfies 0°<γ≤90°.

Exemplarily, as shown in FIGS. 6 and 7, the optical film 200 is in contact with the rubber frame structure 130 at the contact point D. The rubber frame structure 130, on the one hand, can support the optical film 200, and one the other hand, can bond the optical film 200 and the substrate 100, thereby ensuring good overall stability of the backlight module. Further, the included angle γ between the one surface of the optical film 200 facing towards the substrate 100 and the tangent line at the position of the contact point D may be less than or equal to 90° and greater than 0°, which on the one hand, ensures that the preparation process of the rubber frame structure 130 is simple, and on the other hand, the rubber frame structure 130 can reflect the outgoing light of the light-emitting element 110 towards the one side adjacent to the optical film 200, so that the edge light-outgoing amount of the backlight module can be improved and the light-outgoing uniformity can be improved.

Referring to FIGS. 6 and 7, the second reflection surface B includes a ramp. The ramp includes a plane surface or a curved surface; and the width d2 of the rubber frame structure 130 is gradually decreased in a light-outgoing direction S of the backlight module.

In an embodiment, the second reflection surface B may be the plane surface or the curved surface, and in FIGS. 6 and 7, only the case where the second reflection surface B is the curved surface is used as an example for illustration.

Exemplarily, as shown in FIG. 6, the width d2 of the rubber frame structure 130 is gradually decreased in the light-outgoing direction S of the backlight module, that is, the width of a bottom part of the rubber frame structure 130 is greater than the width of a top part of the rubber frame structure 130, which can ensure that the light emitted from the light-emitting element 110 is received on the second reflection surface A and then reflected upward, that is, the outgoing light of the light-emitting element 110 is reflected towards one side facing away from the substrate 100, thereby achieving the light-outgoing adjustment of the backlight module. With respect to a rubber frame structure which is wider at the top and narrower at the bottom, the rubber frame structure 130 provided in the embodiment of the present disclosure can reflect the outgoing light towards the substrate 100, thereby achieving the light-outgoing brightness adjustment and solving the problem of poor light-outgoing uniformity.

Referring to FIG. 7, the second reflection surface B includes the curved surface. The second reflection surface B includes a third reflection position B1 and a fourth reflection position B2. The third reflection position B1 is located on one side of the fourth reflection position B2 adjacent to the substrate 100, and the third reflection position B1 is located on one side of the fourth reflection position B2 adjacent to the light-emitting element 110. An included angle between a tangent line at the third reflection position B1 and a plane where the substrate 100 is located is δ, and an included angle between a tangent line at the fourth reflection position B2 and the plane where the substrate 100 is located is E, where 0°<δ<ε≤90°.

In an embodiment, the second reflection surface B includes the third reflection position B1 and the fourth reflection position B2. The third reflection position B1 is closer to the substrate 100 than the fourth reflection position B2 and closer to the light-emitting element 110 than the fourth reflection position B2. Further, the included angle δ between the tangent line at the third reflection position B1 and the plane where the substrate 100 is located and the included angle E between the tangent line at the fourth reflection position B2 and the plane where the substrate 100 is located satisfy 0°<δ<ε≤90°, that is, the rubber frame structure 130 as shown in FIG. 7 is formed. With respect to a parabolic rubber frame structure (not shown in the figure) in which δ is greater than ε, the solution in the embodiment of the present disclosure can emit more light emitted from the light-emitting element 110 from a vicinity of the rubber frame structure 130, which increases the light-outgoing amount near the rubber frame structure 130 and solves the problem that the light-outgoing amount in the edge area of the backlight module is small, thereby further improving the light-outgoing uniformity, and solving the problem of poor light-outgoing uniformity of the backlight module.

To sum up, the shape of the rubber frame structure 130 is reasonably configured so as to ensure that the light reflected by the rubber frame structure 130 is emitted from the light-outgoing side of the backlight module and that more light is emitted from the vicinity of the rubber frame structure 130, thereby increasing the light-outgoing amount of the vicinity of the rubber frame structure 130, i.e., increasing the light-outgoing amount in the edge area of the backlight module, thereby further improving the light-outgoing uniformity.

Figure 8:
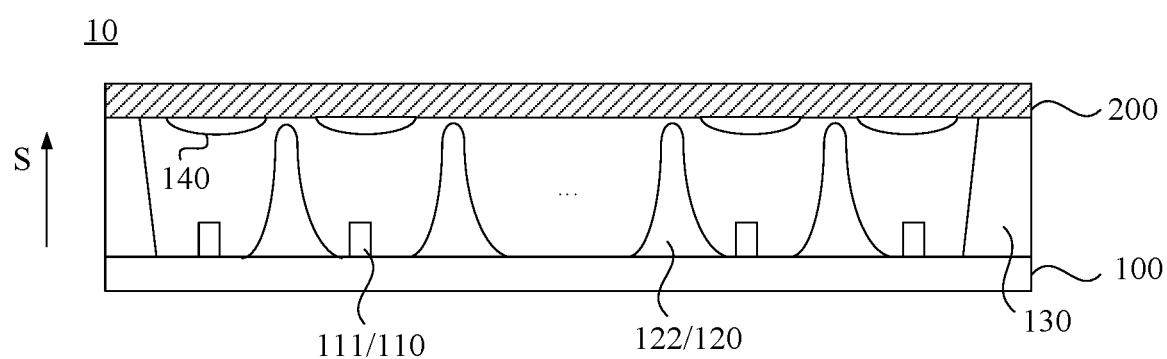
FIG. 8 is another sectional view taken along a line CC' of FIG. 2.

FIG. 8 is another sectional view taken along a line CC' of FIG. 2. As shown in FIG. 8, multiple light homogenizing units 140 are provided on the surface of the optical film 200, the multiple light homogenizing units 140 are in one-to-one correspondence with the multiple light-emitting elements 110, and the light homogenizing units 140 are at least partially overlapped with the light-emitting elements 110 in a light-outgoing direction S of the backlight module 10.

Exemplarily, the light homogenizing units 140 are positioned on the surface of the optical film 200 in the light-outgoing direction S of the backlight module 10, and are configured to diffuse the outgoing light of the optical film 200, thereby improving the light-outgoing uniformity. In an embodiment, the light homogenizing units 140 are in one-to-one correspondence with the light-emitting elements 110. The light homogenizing units 140 can reduce the brightness of areas where the light-emitting elements 110 are located, improve the brightness of gap areas between the light-emitting elements 110, and reduce the brightness difference of the light-outgoing area of the backlight module 10, thereby solving the problem of uneven brightness and darkness and improving the light-outgoing uniformity of the backlight module 10.

Figure 9:
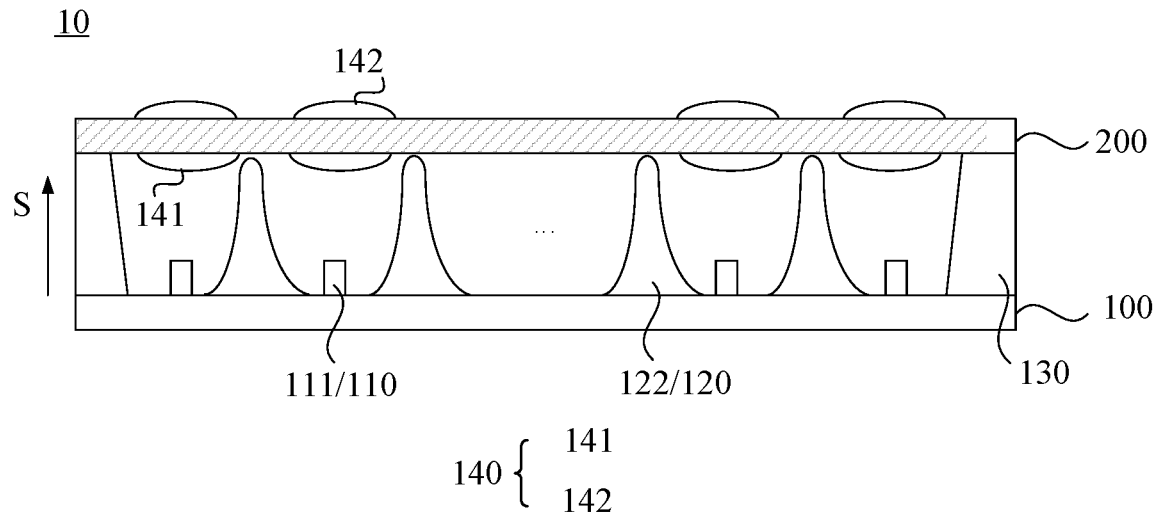
FIG. 9 is another sectional view taken along a line CC' of FIG. 2.
Figure 10:
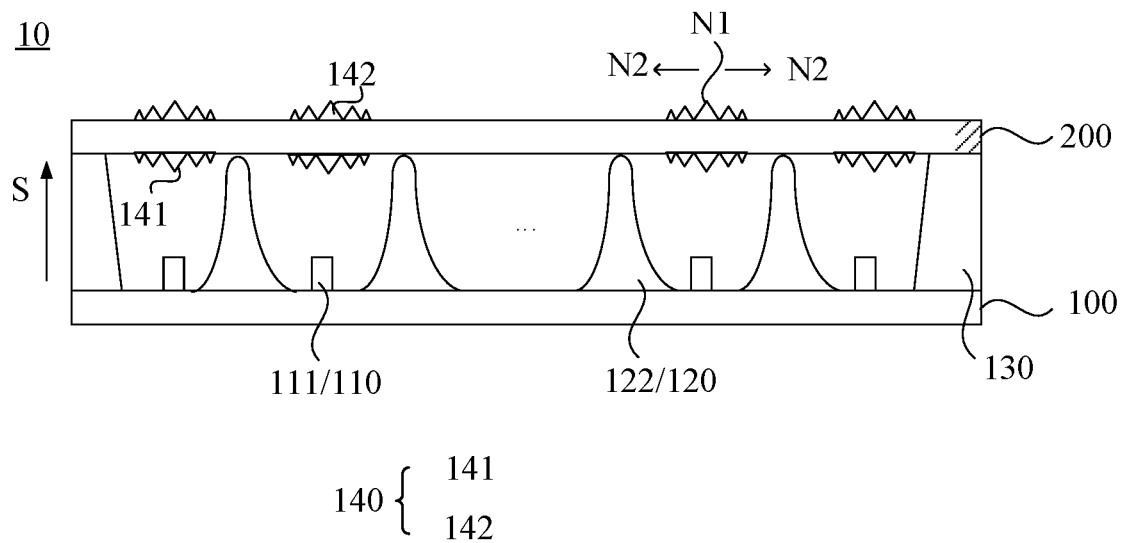
FIG. 10 is another sectional view taken along a line CC' of FIG. 2.

FIG. 9 is another sectional view taken along a line CC' of FIG. 2. FIG. 10 is another sectional view taken along a line CC' of FIG. 2. Referring to FIGS. 8 to 10, multiple light homogenizing units 140 are provided on the surface of the optical film 200, the multiple light homogenizing units 140 include at least one of a first light homogenizing unit 141 adjacent to the substrate 100 and a second light homogenizing unit 142 facing away from the substrate 100. The light homogenizing unit 140 includes at least one of: a convex surface facing away from the optical film 200, and multiple prism structures, where each prism structure is provided with a regular quadrangle bottom and a triangle cross section; and in a direction perpendicular to the substrate 100 and in a direction from a center N1 of a projection of the light-emitting element 110 to an edge N2 of the projection of the light-emitting element 110, the height and the width of the prism structure gradually decrease.

In an embodiment, the multiple light homogenizing units 140 are provided on the surface of the optical film 200, the light homogenizing units 140 include at least one of: the first light homogenizing unit 141 and the second light homogenizing unit 142. The first light homogenizing unit 141 is located on one side of the optical film 200 adjacent to the substrate 100, and the second light homogenizing unit 142 on one side of the optical film 200 facing away from the substrate 100. Exemplarily, as shown in FIG. 8, the optical film 200 in the backlight module 10 may be provided with only the first light homogenizing unit 141. The optical film 200 in the backlight module 10 may be provided with only the second light homogenizing unit 142 (not shown in the figure). As shown in FIGS. 9 and 10, the optical film 200 in the backlight module 10 may be provided with both the first light homogenizing unit 141 and the second light homogenizing unit 142. The multiple light homogenizing units 140 are provided on the surface of the optical film 200, so that the brightness difference in the light-outgoing area of the backlight module 10 can be effectively reduced, thereby solving the problem of uneven brightness and darkness and improving the light-outgoing uniformity of the backlight module 10.

As shown in FIGS. 8 and 9, the light homogenizing unit 140 may include the convex surface facing away from the optical film 200. For example, the first light homogenizing unit 141 may protrude towards the substrate, and the second light homogenizing unit 142 may protrude facing away from the substrate, thereby adjusting the light-outgoing direction of the light and reducing the brightness difference in the light-outgoing area of the backlight module 10.

As shown in FIG. 10, the light homogenizing unit 140 may include multiple prism structures, where each prism structure is provided with the regular quadrangle bottom and the triangle cross section, and FIG. 10 only shows the shape of the cross section of the prism structure. A bottom surface of the light homogenizing unit 140 is a surface completely in contact with the optical film 200; and the cross section of the light homogenizing unit 140 is a plane parallel to the light-outgoing direction S of the light-emitting element 110. In the direction perpendicular to the substrate 100, that is, in the light-outgoing direction S of the backlight module 10, as shown in FIG. 10, in the direction from the center N1 of the projection of the light-emitting element 110 to the edge N2 of the projection of the light-emitting element 110, the height and the width of the prism structure gradually decrease. In the structure in which the light homogenizing unit 140 is designed to correspond to the light-emitting element 110, the height and the width of the prism structure gradually decrease, so that the brightness difference of the light-outgoing area of the backlight module 10 can be reduced more finely, thereby solving the problem of uneven brightness and darkness and improving the light-outgoing uniformity of the backlight module 10.

Figure 11:
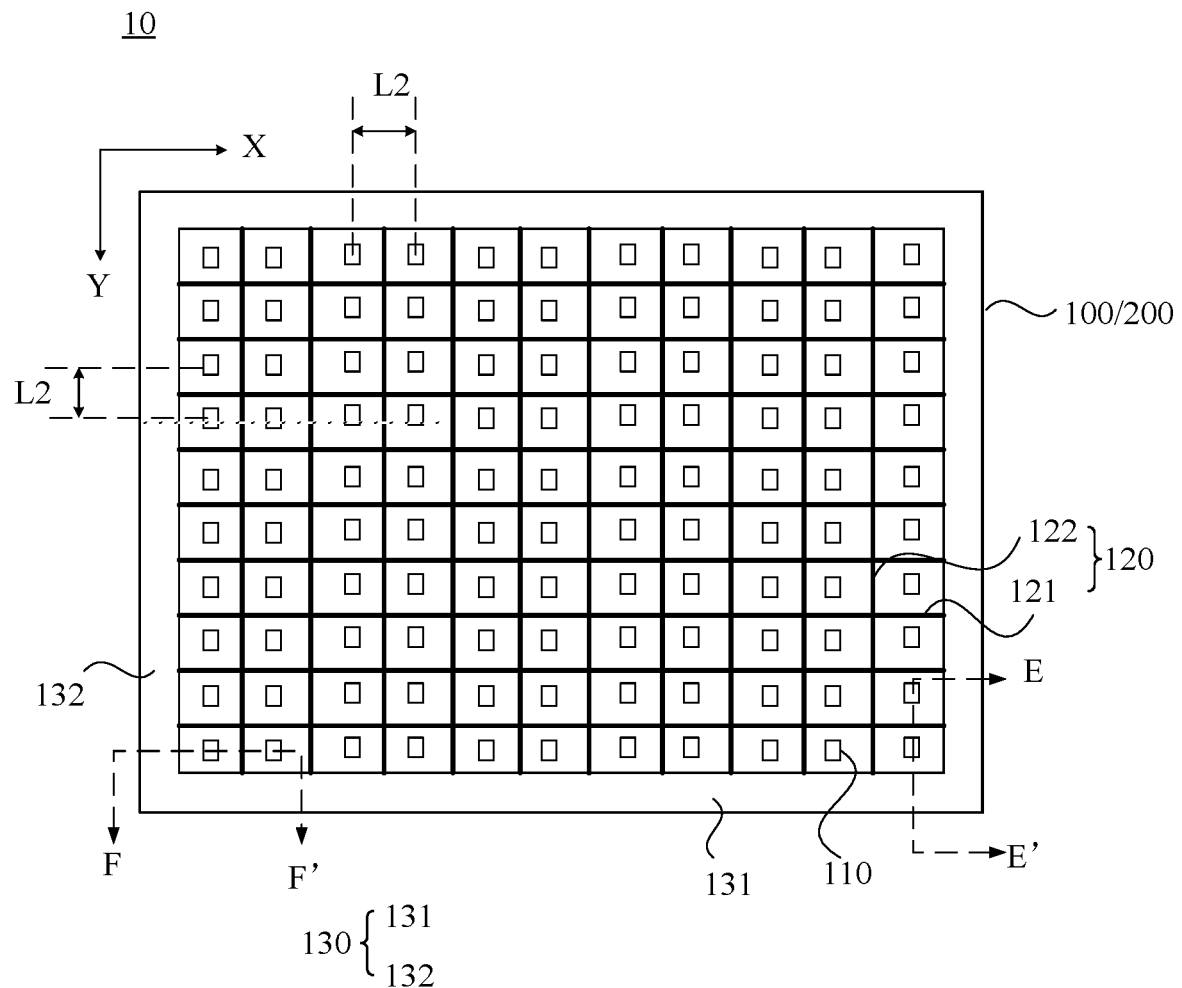
FIG. 11 is a top view of another backlight module provided by an embodiment of the present disclosure.
Figure 12:
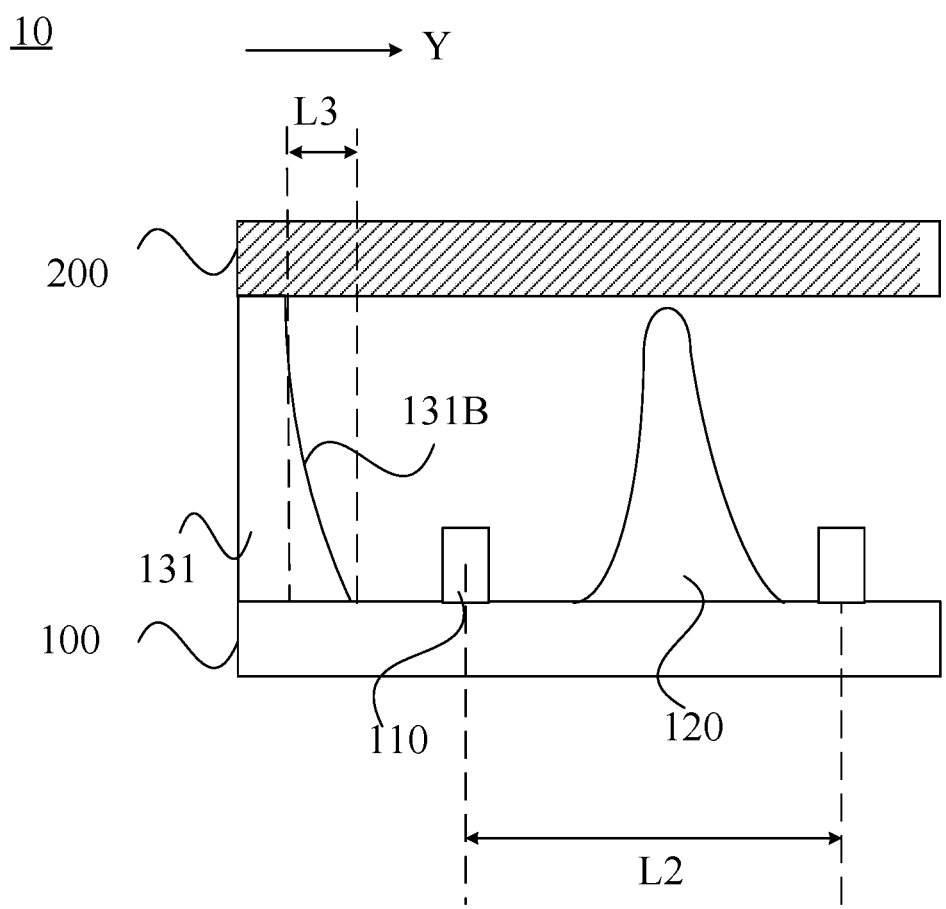
FIG. 12 is a sectional view taken along a line EE' of FIG. 11.
Figure 13:
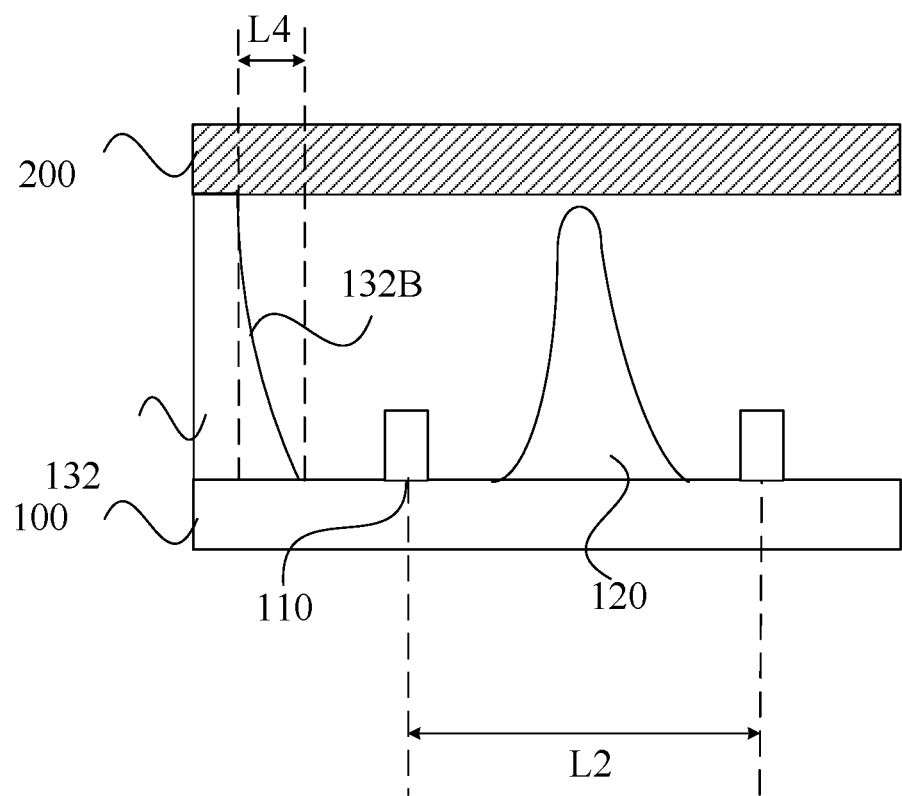
FIG. 13 is a sectional view taken along a line FF' of FIG. 11.

FIG. 11 is a top view of another backlight module provided by an embodiment of the present disclosure. FIG. 12 is a sectional view taken along a line EE' of FIG. 11. FIG. 13 is a sectional view taken along a line FF' of FIG. 11. Referring to FIGS. 11 to 13, multiple light-emitting elements 110 are arranged in an array in a first direction X and a second direction Y, and the first direction X and the second direction Y intersect with each other and are both parallel to a plane where the substrate 100 is located. In the first direction X or the second direction Y, a distance between two adjacent light-emitting elements 110 is L2; and the rubber frame structure 130 includes a first rubber frame structure 131 extending in the first direction X and a second rubber frame structure 132 extending in the second direction Y. The first rubber frame structure 131 includes a second A reflection surface 131B, and the second rubber frame structure 132 includes a second B reflection surface 132B; and a width of a vertical projection of the second A reflection surface 131B on the plane where the substrate 100 is located in the second direction Y is L3, and a width of a vertical projection of the second B reflection surface 132B on the plane where the substrate is located in the first direction X is L4, where L3≤L2 and L4≤L2.

In an embodiment, as shown in FIG. 11, the rubber frame structure 130 includes the first rubber frame structure 131 and the second rubber frame structure 132. The first rubber frame structure 131 extends in the first direction X and the second rubber frame structure 132 extends in the second direction Y. The light-emitting element 110 and the reflection structure 120 are located within an area limited by the first rubber frame structure 131 and the second rubber frame structure 132. The first rubber frame structure 131 includes the second A reflection surface 131B, and the second rubber frame structure 132 includes the second B reflection surface 132B. The second A reflection surface 131B and the second B reflection surface 132B are configured, so that the light-outgoing amount in the edge area of the backlight module 10 in the first direction X and the second direction Y can be ensured to be adjusted, thereby solving the problem of the light-outgoing uniformity.

Further, referring to FIGS. 11 to 13, in the first direction X and the second direction Y, the distance between two adjacent light-emitting elements 110 is L2. The width of the projection of the second A reflection surface 131B on the plane where the substrate 100 is located and the width of the projection of the second B reflection surface 132B on the plane where the substrate 100 is located are both less than or equal to the distance between the two adjacent light-emitting elements 110, which ensures that the rubber frame structure 130 is capable of reflecting the light emitted from the light-emitting element 110 only to the edge area of the backlight module 10 but not to a central area of the backlight module 10, thereby increasing the light-outgoing amount in the edge area and adjusting the light-outgoing uniformity of the backlight module 10. Further, the width of the projection of the second A reflection surface 131B on the plane where the substrate 100 is located and the width of the projection of the second B reflection surface 132B on the plane where the substrate 100 is located are both less than or equal to the distance between the two adjacent light-emitting elements 110, which can also ensure that the backlight module 10 has a relatively large light-outgoing area so as to achieve a relatively large light-outgoing aperture ratio of the backlight module 10.

Figure 14:
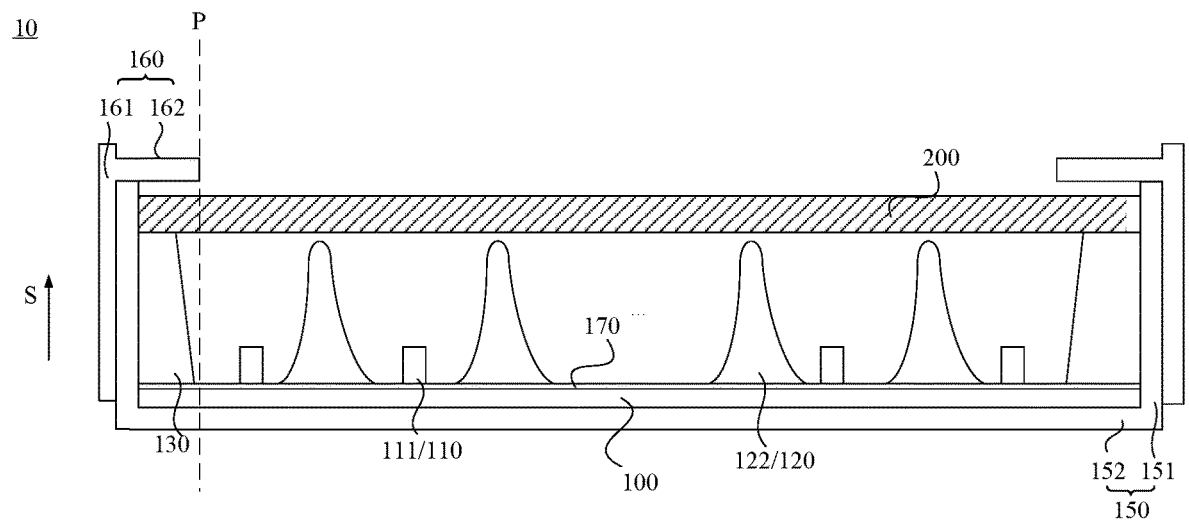
FIG. 14 is another sectional view taken along a line CC' of FIG. 2.

FIG. 14 is another sectional view taken along a line CC' of FIG. 2. Referring to FIG. 14, the backlight module 10 further includes a support sheet metal 150. The support sheet metal 150 includes a first sheet metal section 151 and a second sheet metal section 152 connected to the first sheet metal section 151, the first sheet metal section 151 is disposed in a light-outgoing direction S of the backlight module 10 and is located on one side of the rubber frame structure 130 facing away from the light-emitting element 110, and the second sheet metal section 152 is parallel to a plane where the substrate 100 is located and is located on one side of the substrate 100 facing away from the light-emitting element 110. The rubber frame structure 130 is connected to at least one of the first sheet metal section 151 and the second sheet metal section 152 through an adhesive.

Exemplarily, as shown in FIG. 14, the support sheet metal 150 is configured to support and protect the backlight module 10 to ensure the stability of the backlight module 10. In an embodiment, the support sheet metal 150 includes the first sheet metal section 151 and the second sheet metal section 152 connected to the first sheet metal section 151. The first sheet metal section 151 is arranged in the light-outgoing direction S of the backlight module 10 and is located on the one side of the rubber frame structure 130 facing away from the light-emitting element 110, and the first sheet metal section 151 is used for supporting and protecting the backlight module 10 from a light-outgoing side of the backlight module 10. The second sheet metal section 152 is parallel to the plane where the substrate 100 is located and is located on the one side of the substrate 100 facing away from the light-emitting element 110, and the second sheet metal section 152 is used for supporting and protecting the backlight module 10 from a side surface of the backlight module 10.

Further, the rubber frame structure 130 is connected to the first sheet metal section 151 by the adhesive, or the rubber frame structure 130 is connected to the second sheet metal section 152 by the adhesive, or the rubber frame structure 130 is connected to both the first sheet metal section 151 and the second sheet metal section 152 by the adhesive. In an embodiment, the rubber frame structure 130 and the support sheet metal 150 may be connected by a liquid glue, a solid glue, a transparent glue or the like. The embodiment of the present disclosure does not limit the specific connection form between the rubber frame structure 130 and the support sheet metal 150. The rubber frame structure 130 is fixed by the first sheet metal section 151 and the second sheet metal section 152 so as to further improve the stability of the backlight module 10.

Referring to FIG. 14, the backlight module 10 further includes a frame 160. The frame 160 includes a first frame section 161 and a second frame section 162 connected to the first frame section 161, the first frame section 161 is disposed in the light-outgoing direction S of the backlight module 10 and is located on one side of the first sheet metal section 151 facing away from the rubber frame structure 130, and the second frame section 162 is parallel to the plane where the substrate 100 is located and covers the first sheet metal section 151 and the rubber frame structure 130 in the light-outgoing direction S of the backlight module 10.

In an embodiment, as shown in FIG. 14, the frame 160 includes the first frame section 161 and the second frame section 162 connected to the first frame section 161. The first frame section 161 is located on an outer side of the first sheet metal section 151, that is, in the light-outgoing direction S of the backlight module 10, the first frame section 161 is located on the one side of the first sheet metal section 151 facing away from the rubber frame structure 130, and serves as a protection frame of the first sheet metal section 151. The second frame section 162 is parallel to the plane where the substrate 100 is located. Moreover, as shown by the dotted line P in FIG. 14, the second frame section 162 covers the first sheet metal section 151 and the rubber frame structure 130 so as to ensure the rubber frame structure 130 to be invisible. Further, a foam structure may be arranged on one side of the second frame section 162 facing away from the substrate 100, and other elements located on the foam structure may be bore by a softer foam structure to avoid damage to the remaining elements thereon and the frame 160. Further, the second frame section 162 may also be served as a limiting structure of the optical film 200 to prevent the optical film 200 from warping and escaping during the mechanical testing process, thereby ensuring the structural stability of the backlight module.

Referring to FIG. 2 or 11, the rubber frame structure 130 is integrally arranged.

In an embodiment, as shown in FIG. 2 or 11, the rubber frame structure 130 may be an integral arranged structure, so that the rubber frame structure 130 has a simple configuration manner, a simple preparation process, and a relatively high preparation efficiency.

Figure 15:
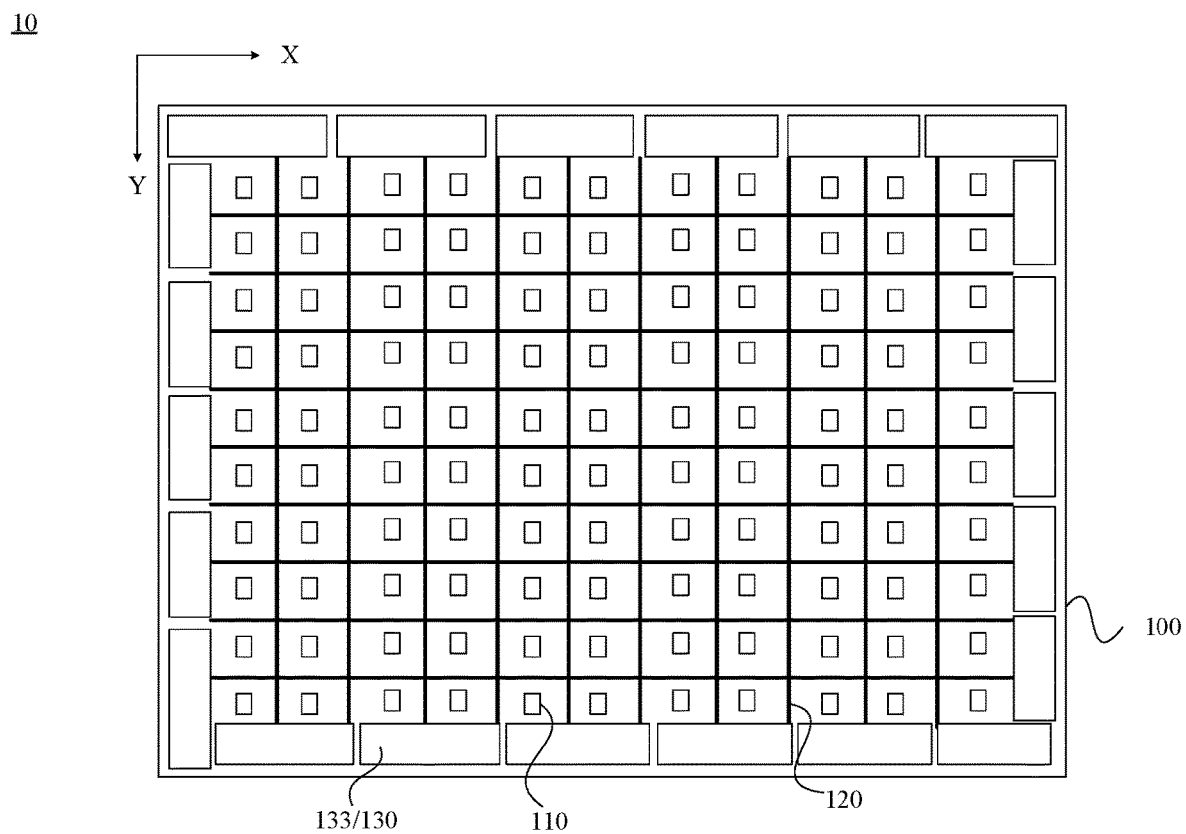
FIG. 15 is a top view of another backlight module provided by an embodiment of the present disclosure.

FIG. 15 is a top view of another backlight module provided by an embodiment of the present disclosure. Referring to FIG. 15, the rubber frame structure 130 includes multiple independent sub-rubber-frame structures 133. The multiple sub-rubber-frame structures 133 are sequentially arranged in an edge of the backlight module 10.

In an embodiment, the rubber frame structure 130 may be a split structure, for example, the rubber frame structure 130 includes multiple independent sub-rubber-frame structures 133. The multiple sub-rubber-frame structures 133 are sequentially arranged in an edge area of the backlight module 10 in a first direction X and a second direction Y. Further, in a case where the rubber frame structure 130 includes multiple independent sub-rubber-frame structures 133, a gap may be provided between two adjacent sub-rubber-frame structures 133. In this case, when the rubber frame structure 130 expands due to heat, the gap between the two adjacent sub-rubber-frame structures 133 reserves an expansion space for the expansion of the sub-rubber-frame structures 133, so that a case where the rubber frame structure 130 cannot be installed into the sheet metal due to the thermal expansion can be avoided, and the assembly difficulty of the backlight module is reduced by splitting the rubber frame structure. Further, the case where the rubber frame structure 130 includes multiple independent sub-rubber-frame structures 133 can be applied at a relatively high assembly temperature, which can reduce the temperature requirements of the backlight module 10 during the assembly and ensure adaptation of the backlight module 10 to different assembly environments.

Referring to FIG. 14, a reflection layer 170 is provided on one surface of the substrate 100 adjacent to the light-emitting element 110, and the reflection layer 170 includes a reflection ink.

In an embodiment, the reflection layer 170 is arranged on the one side of the substrate 100 adjacent to the light-emitting element 110. The arrangement of the reflection layer 170 can ensure light emitted from the light-emitting element 110 to be transmitted to the substrate 100 and then continuously reflected to a light-outgoing surface of the backlight module 10, thereby increasing the light-outgoing amount of the backlight module 10, increasing the light-outgoing brightness of the backlight module 10, and improving the utilization rate of the light emitted from the light-emitting element. Further, the light emitted from the light-emitting element 110 may be reflected multiple times back and forth between the reflection structure 120, the rubber frame structure 130, the reflection layer 170 and the optical film, thereby increasing the light mixing distance, facilitating the thinning design of the backlight module 10 and solving the problem of the larger thickness of the backlight module 10. Further, the reflection layer 170 may include an emitting ink, such as white ink. The specific configuration manner of the reflection layer is not limited in the embodiment of the present disclosure.

On the basis of the preceding embodiments, the backlight module 10 includes multiple backlight partitions (not shown in the figure), and the case where two backlight partitions have different light-emitting brightness exists.

In an embodiment, the backlight module 10 may be provided with multiple backlight partitions, and different backlight partitions may display different levels of brightness. Different backlight partitions are arranged, so that the light-emitting brightness in different backlight partitions can be different. Such arrangement has the advantage that the display device using the backlight module 10 can achieve a screen effect of high dynamic range and make the picture more delicate.

Figure 16:
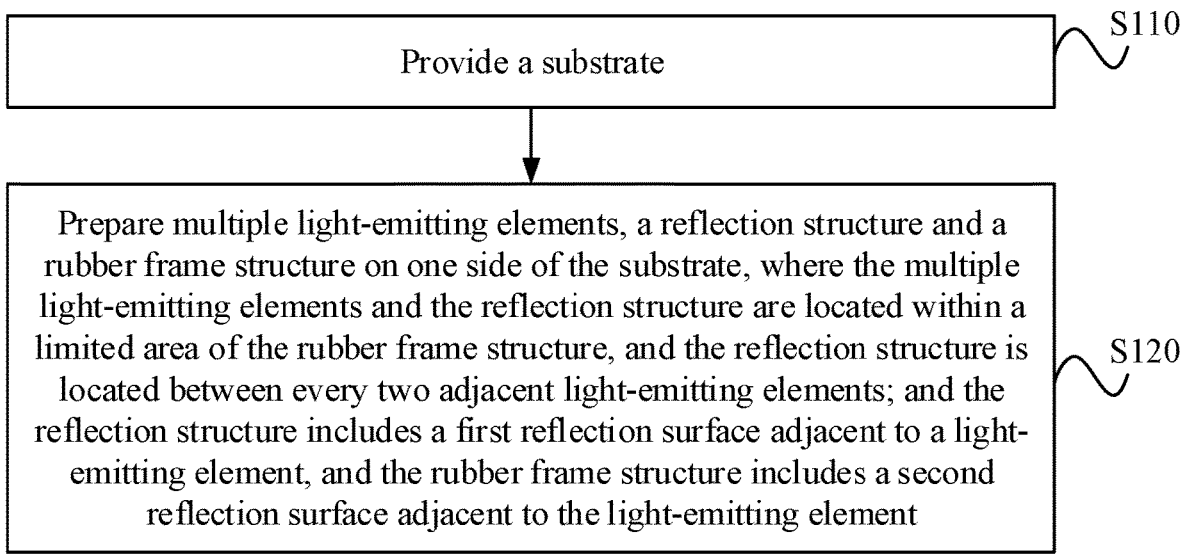
FIG. 16 is a flowchart of a preparation method of a backlight module provided by an embodiment of the present disclosure.

Based on the same inventive concept, an embodiment of the present disclosure further provides a preparation method of a backlight module. FIG. 16 is a flowchart of a preparation method of a backlight module provided by an embodiment of the present disclosure. As shown in FIG. 16, the preparation method of the backlight module provided in the embodiment of the present disclosure may include the steps described below.

In S110, a substrate is provided.

Exemplarily, the provided substrate may be a rigid substrate, such as glass or the like.

In S120, multiple light-emitting elements, a reflection structure and a rubber frame structure are prepared on one side of the substrate. The multiple light-emitting elements and the reflection structure are located within a limited area of the rubber frame structure, and the reflection structure is located between every two adjacent light-emitting elements. The reflection structure includes a first reflection surface adjacent to a light-emitting element, and the rubber frame structure includes a second reflection surface adjacent to the light-emitting element.

Exemplarily, the light-emitting elements, the reflection structure and the rubber frame structure are prepared on the one side of the substrate. The light-emitting element may be a light-emitting diode, for example, may be an electronic element such as a Micro light-emitting diode (Micro LED) or a Mini light-emitting diode (Mini LED). The prepared reflection structure includes a first reflection surface, and the rubber frame structure includes a second reflection surface. The light-emitting element may include multiple light-emitting surfaces, for example, a top surface and side surfaces are all light-emitting surfaces. Light emitted from the light-emitting element may be continuously reflected through the first reflection surface and the second reflection surface, thereby reducing the light mixing distance of the backlight module, further reducing the thickness of the backlight module and improving the light-outgoing uniformity of the backlight module.

Further, the reflection structure is located between every two adjacent light-emitting elements, which can block the outgoing light of the light-emitting element from being transmitted to a light-outgoing area of the adjacent light emitting element, thereby eliminating the light crosstalk between the adjacent light-emitting elements, and further solving the problem of low contrast of the light-outgoing brightness.

To sum up, in the preparation method of the backlight module provided by the embodiment of the present disclosure, the light-emitting elements, the reflection structure and the rubber frame structure are prepared on the one side of the substrate, and further the first reflection surface is prepared on the one side of the reflection structure adjacent to the light-emitting element and the second reflection surface is prepared on the one side of the rubber frame structure adjacent to the light-emitting element, so that the light emitted from the light-emitting element is continuously reflected through the first reflection surface and the second reflection surface, thereby reducing the light mixing distance of the backlight module, further reducing the thickness of the backlight module and solving the problem of the larger thickness of the backlight module. The crosstalk between the outgoing lights of the adjacent light-emitting elements is blocked by the reflection structure to improve the light-outgoing contrast of the backlight module. Moreover, the reflection structure and the rubber frame structure adjust and reflect the outgoing light of the light-emitting element, which can improve the light-outgoing uniformity of the backlight module.

Optionally, the rubber frame structure is integrally arranged.

In an embodiment, the step in which the rubber frame structure is prepared on the one side of the substrate includes the step described below.

The rubber frame structure on the one side of the substrate is prepared at a preset temperature, where the preset temperature T satisfies −20° C.≤T≤25° C.

Exemplarily, the rubber frame structure may be integrally arranged to reduce the preparation process and improve the production efficiency. In an embodiment, the preset temperature T required in the preparation process of the rubber frame structure satisfies −20° C.≤T≤25° C. Exemplarily, the preset temperature T may be −20° C., 25° C., or any temperature from −20° C. to 25° C., such as 0° C., 5° C., 10° C., 15° C. or 20° C. The rubber frame structure prepared at the preset temperature T does not produce the excessive volume expansion, which ensures that the rubber frame structure can be loaded with a support sheet metal and ensures that a simple equipment process.

Alternatively, the step in which the rubber frame structure is prepared on the one side of the substrate includes the steps described below.

Multiple independent sub-rubber-frame structures are prepared on the one side of the substrate. The multiple sub-rubber-frame structures are sequentially arranged in edges of the backlight module.

Exemplarily, the rubber frame structure may be multibody arranged, that is, the rubber frame structure includes multiple independent sub-rubber-frame structures. The multiple sub-rubber-frame structures are sequentially arranged in the edges of the backlight module so as to ensure the light-outgoing brightness of the edge area of the backlight module. A gap is provided between every two adjacent sub-rubber-frame structures. Therefore, when the rubber frame structure expands due to heat, the gap between the every two adjacent sub-rubber-frame structures reserves an expansion space for the expansion of the sub-rubber-frame structures, so that a case where the rubber frame structure cannot be installed into the sheet metal due to the thermal expansion can be avoided, and the assembly difficulty of the backlight module is reduced by splitting the rubber frame structure.

Figure 17:
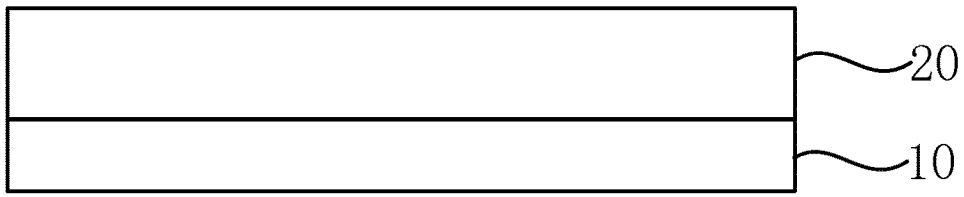
FIG. 17 is a structure diagram of a display device provided by an embodiment of the present disclosure.

Based on the same inventive concept, an embodiment of the present disclosure further provides a display device. FIG. 17 is a structure diagram of a display device provided by an embodiment of the present disclosure. As shown in FIG. 17, the display device 1 includes the backlight module 10 provided by any embodiment of the present disclosure. Since the display device 1 includes any one of the above backlight modules 10, the display device 1 has corresponding functions and beneficial effects, which will not be described here.

Referring to FIG. 17, the display panel provided by the embodiment of the present disclosure further includes a display panel 20. The display panel 20 may be a display panel without a self-luminous function, such as a liquid crystal display panel. The deflection of the liquid crystal in the liquid crystal display panel is controlled so as to achieve the backlight optical transmission and the normal display of the display device.

The display device 1 provided by the embodiments of the present application may be any electronic product with a display function, including but not limited to: phones, televisions, laptops, desktop displays, tablet computers, digital cameras, smart bracelets, smart glasses, in-vehicle displays, industry-controlling equipment, medical displays, touch interactive terminals, etc., which will not be particularly limited in the embodiments of the present application.

It is to be noted that the preceding are only preferred embodiments of the present disclosure and technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A backlight module, comprising:
   a substrate; and
   a plurality of light-emitting elements, a reflection structure and a rubber frame structure, wherein the plurality of light-emitting elements, the reflection structure, the rubber frame structure are located on one side of the substrate, the plurality of light-emitting elements and the reflection structure are located within a limited area of the rubber frame structure, and the reflection structure is located between every two adjacent light-emitting elements of the plurality of light-emitting elements,
   wherein the reflection structure comprises a first reflection surface adjacent to a light-emitting element, and the rubber frame structure comprises a second reflection surface adjacent to the light-emitting element; and
   wherein the rubber frame structure is independent of the reflection structure.

2. The backlight module of claim 1, wherein the plurality of light-emitting elements are arranged in an array in a first direction and a second direction, and the first direction and the second direction intersect with each other and are both parallel to a plane where the substrate is located; and
   the reflection structure comprises a first sub-reflection structure extending in the first direction and a second sub-reflection structure extending in the second direction, and the first sub-reflection structure and the second sub-reflection structure intersect with each other to limit at least a part of edges of an arrangement area of the light-emitting element.

3. The backlight module of claim 2, wherein the plurality of light-emitting elements comprise a first-type light-emitting element and a second-type light-emitting element;
   the first-type light-emitting element is located at an edge position of the backlight module, the first sub-reflection structure and the second sub-reflection structure are configured to limit a part of edges of an arrangement area of the first-type light-emitting element, and the rubber frame structure is configured to limit a remaining part of the edges of the arrangement area of the first-type light-emitting element; and
   the second-type light-emitting element is located at a non-edge position of the backlight module, the first sub-reflection structure and the second sub-reflection structure are configured to limit all of edges of an arrangement area of the second-type light-emitting element.

4. The backlight module of claim 1, wherein the first reflection surface comprises a ramp, and the ramp of the first reflection surface comprises a plane surface or a curved surface; and
a width of the reflection structure is gradually decreased in a light-outgoing direction of the backlight module.

5. The backlight module of claim 4, wherein the first reflection surface comprises the curved surface;
the first reflection surface comprises a first reflection position and a second reflection position, wherein the first reflection position is located on one side of the second reflection position adjacent to the substrate, and the first reflection position is located on one side of the second reflection position adjacent to the light-emitting element; and
an included angle between a tangent line at the first reflection position and a plane where the substrate is located is $\alpha$, and an included angle between a tangent line at the second reflection position and the plane where the substrate is located is $\beta$, wherein $0°<\alpha<\beta\leq 90°$.

6. The backlight module of claim 1, further comprising: an optical film located on one side of the reflection structure and the rubber frame structure facing away from the substrate.

7. The backlight module of claim 6, wherein the second reflection surface is in contact with the optical film at a contact point, and the contact point is located on the second reflection surface; and an included angle $\gamma$ between one surface of the optical film facing toward the substrate and a tangent line at a position of the contact point satisfies $0°<\gamma\leq 90°$.

8. The backlight module of claim 7, wherein the second reflection surface comprises a ramp, and the ramp of the second reflection surface comprises a plane surface or a curved surface; and
a width of the rubber frame structure is gradually decreased in a light-outgoing direction of the backlight module.

9. The backlight module of claim 8, wherein the second reflection surface comprises the curved surface:
the second reflection surface comprises a third reflection position and a fourth reflection position, wherein the third reflection position is located on one side of the fourth reflection position adjacent to the substrate, and the third reflection position is located on one side of the fourth reflection position adjacent to the light-emitting element; and
an included angle between a tangent line at the third reflection position and a plane where the substrate is located is $\delta$, and an included angle between a tangent line at the fourth reflection position and the plane where the substrate is located is $\varepsilon$, wherein $0°<\delta<\varepsilon<90°$.

10. The backlight module of claim 6, wherein a plurality of light homogenizing units are provided on a surface of the optical film, the plurality of light homogenizing units are in one-to-one correspondence with the plurality of light-emitting elements, and the plurality of light homogenizing units are at least partially overlapped with the plurality of light-emitting elements in a light-outgoing direction of the backlight module.

11. The backlight module of claim 10, wherein the plurality of light homogenizing units is disposed on the surface of the optical film, and the plurality of light homogenizing units comprises at least one of a first light homogenizing unit adjacent to the substrate or a second light homogenizing unit facing away from the substrate; and
the light homogenizing unit comprises at least one of: a convex surface facing away from the optical film, or a plurality of prism structures each with a regular quadrangle bottom and a triangle cross section; and a height and a width of each prism structure gradually decrease in a direction perpendicular to the substrate and in a direction from a center of a projection of the light-emitting element to an edge of the projection of the light-emitting element.

12. The backlight module of claim 1, wherein the plurality of light-emitting elements are arranged in an array in a first direction and a second direction, and the first direction and the second direction intersect with each other and are both parallel to a plane where the substrate is located;
a distance between two adjacent light-emitting elements of the plurality of light-emitting elements is L2 in the first direction or the second direction; and
the rubber frame structure comprises a first rubber frame structure extending in the first direction and a second rubber frame structure extending in the second direction, wherein the first rubber frame structure comprises a second A reflection surface, and the second rubber frame structure comprises a second B reflection surface; and a width of a vertical projection of the second A reflection surface on the plane where the substrate is located in the second direction is L3, and a width of a vertical projection of the second B reflection surface on the plane where the substrate is located in the first direction is L4, wherein L3≤L2 and L4≤L2.

13. The backlight module of claim 1, further comprising: a support sheet metal, wherein the support sheet metal comprises a first sheet metal section and a second sheet metal section connected with the first sheet metal section, the first sheet metal section is disposed in a light-outgoing direction of the backlight module and is located on one side of the rubber frame structure facing away from the light-emitting element, and the second sheet metal section is parallel to a plane where the substrate is located and is located on one side of the substrate facing away from the light-emitting element; and
the rubber frame structure is connected to at least one of the first sheet metal section or the second sheet metal section through an adhesive.

14. The backlight module of claim 13, further comprising: a frame, wherein the frame comprises a first frame section and a second frame section connected with the first frame section, the first frame section is disposed in the light-outgoing direction of the backlight module and is located on one side of the first sheet metal section facing away from the rubber frame structure, and the second frame section is parallel to the plane where the substrate is located and covers the first sheet metal section and the rubber frame structure in the light-outgoing direction of the backlight module.

15. The backlight module of claim 1, wherein the rubber frame structure is integrally arranged,
or,
the rubber frame structure comprises a plurality of independent sub-rubber-frame structures, and the plurality of sub-rubber-frame structures are sequentially arranged in edges of the backlight module.

16. The backlight module of claim 1, wherein a reflection layer is provided on one surface of the substrate adjacent to the light-emitting element, and the reflection layer comprises a reflection ink.

17. The backlight module of claim 1, wherein the backlight module comprises a plurality of backlight partitions, and two backlight partitions of the plurality of backlight partitions have different light-emitting brightness.

18. A preparation method for a backlight module, comprising:
providing a substrate;
preparing a plurality of light-emitting elements, a reflection structure and a rubber frame structure on one side of the substrate, wherein the plurality of light-emitting elements and the reflection structure are located within a limited area of the rubber frame structure, the reflection structure is located between every two adjacent light-emitting elements of the plurality of light-emitting elements, the reflection structure comprises a first reflection surface adjacent to a light-emitting element, the rubber frame structure comprises a second reflection surface adjacent to the light-emitting element, and the rubber frame structure is independent of the reflection structure.

19. The preparation method of claim 18, wherein the rubber frame structure is integrally arranged; and
preparing the rubber frame structure on the one side of the substrate comprises:
preparing the rubber frame structure on the one side of the substrate at a preset temperature, wherein the preset temperature T satisfies −20° C.≤T≤25° C.,
or,
preparing a plurality of independent sub-rubber-frame structures on the one side of the substrate, wherein the plurality of sub-rubber-frame structures are sequentially arranged in edges of the backlight module.

20. A display device, comprising a backlight module, wherein the backlight module comprises:
a substrate; and
a plurality of light-emitting elements, a reflection structure and a rubber frame structure, wherein the plurality of light-emitting elements, the reflection structure, the rubber frame structure are located on one side of the substrate, the plurality of light-emitting elements and the reflection structure are located within a limited area of the rubber frame structure, and the reflection structure is located between every two adjacent light-emitting elements of the plurality of light-emitting elements,
wherein the reflection structure comprises a first reflection surface adjacent to a light-emitting element, and the rubber frame structure comprises a second reflection surface adjacent to the light-emitting element; and
wherein the rubber frame structure is independent of the reflection structure.

* * * * *